United States Patent [19]
Chuang et al.

[11] Patent Number: 5,962,342
[45] Date of Patent: Oct. 5, 1999

[54] ADJUSTABLE METHOD FOR ELIMINATING TRENCH TOP CORNERS

[75] Inventors: Andy Chuang, Hsinchu; Tzung-Han Lee, Taipei, both of Taiwan

[73] Assignee: United Microelectronics Corporation, Taiwan

[21] Appl. No.: 08/993,870

[22] Filed: Dec. 18, 1997

[30] Foreign Application Priority Data

Oct. 27, 1997 [TW] Taiwan ................................. 86115834

[51] Int. Cl.$^6$ .................................................. H01L 21/00
[52] U.S. Cl. .......................... 438/692; 438/713; 438/734; 438/744; 438/221; 216/67; 216/79
[58] Field of Search .................................. 438/692, 701, 438/713, 724, 734, 744, 723, 743, 221; 216/67, 79

[56] References Cited

U.S. PATENT DOCUMENTS 5,843,849 12/1998 Hoshino et al. .................... 438/743 X Primary Examiner—William Powell
Attorney, Agent, or Firm—Robin & Champagne, P.C.

[57] ABSTRACT

An adjustable method for making trenches for a semiconductor IC device having eliminated top corners is disclosed. The adjustable method includes forming a masking layer on the surface of the silicon nitride layer covering the device substrate that has openings corresponding to the openings of the trenches formed. Dimension of the masking layer opening is relatively greater than the dimension of the opening of the corresponding trench. An anisotropic etching procedure is then performed against the portions of the device substrate exposed out of the coverage of the masking layer, and the anisotropic etching shapes the trench sidewalls into sloped ones having larger dimension at the opening than at the surface of the filling material inside the trenches. This eliminates the top corners at the edges of the trench opening, charge accumulation and consequent leakage current can thus be prevented.

14 Claims, 3 Drawing Sheets

ADJUSTABLE METHOD FOR ELIMINATING TRENCH TOP CORNERS

BACKGROUND OF THE INVENTION

1. Field of the Invention

This invention relates in general to the fabrication of semiconductor IC devices and, in particular, to a method of making trenches without undesirable top corners. More particularly, this invention relates to an adjustable method for eliminating trench top corners for preventing electric charge accumulation and the consequent damaging leakage current discharge.

2. Description of Related Art

Trenching is a technique widely employed for the isolation of circuit elements in the circuitry of semiconductor IC devices. For example, DRAM is a specific category of IC devices that employs the trench configuration to provide electrical isolation between consecutive transistors in the arrays of memory cells. Trenching can provide electrical isolation for circuit elements that requires less space than required by regional local oxidation. In the case of DRAMs, in addition to providing electrical isolation, trenches can also be used to construct storage capacitors for the memory cell units in the array. Such trenches are normally formed in processes requiring the use of certain special gaseous mixtures. These gaseous mixtures are controlled by some hardware equipment so that device substrate can be properly etched to form the trenches.

Dry etching is the traditional procedure widely used to make trenches in the device substrate. Plasma, rather than fluidic etching solution, is used to perform thin-film etching. One of the primary advantages of thin-film etching is that anisotropic etching can be achieved to have a greater etch consumption rate in the vertical direction than in the lateral. Since there is relatively much smaller etch consumption rate in the lateral orientation when compared with the vertical, the phenomenon of undercut is therefore avoided. Trenches obtained by anisotropic etching may therefore exhibit very straight trench sidewalls, with corners turning at an angle of nearly 90 degrees.

FIGS. 1a and 1b are a cross-sectional views showing the selected cross sections of the structural configuration of a trench together with its filled material as obtained in a conventional chemical-mechanical polishing procedure. As is illustrated in FIG. 1a, oxide layer 11 and silicon nitride layer 12 are subsequently formed on the device substrate 10. A photoresist layer is then formed covering the silicon nitride layer 12 which is then defined with specific patterns. The patterned photoresist layer is then used as the protective mask for implementing an anisotropic etching procedure to form the trenches 13. Afterwards, the photoresist layer is then removed.

Then, a layer of material 14 is formed covering the silicon nitride layer 12 as well as being filled in the trenches 13. A chemical-mechanical polishing (CMP) procedure is then employed to completely remove the entire silicon nitride layer 12 and the layer 14 on top, leaving the filled material 14 inside the trenches 13. The oxide layer 11 is also removed in the CMP procedure, resulting in the structural configuration as shown in FIG. 1b. Surface of the structure of FIG. 1b does not present a true flat plane.

Rather, shallow areas in the trench regions introduce top corners, as identified by reference numerals 15 in the drawing. These top corners 15 have turning angles nearly 90 degrees that can easily result in electric charge accumulation when the device substrate is energized, and leakage currents arise in these top corner areas as the fabricated IC device is processed further. In the subsequent fabrication procedural steps, whenever there are electrically conductive materials striding across the region where substrate 10 and the layer 14 meet each other, such leakage currents incur short-circuiting to degrade device reliability. Fabrication yield rate is therefore deteriorated, a phenomenon known as the kink effect.

SUMMARY OF THE INVENTION

It is therefore an object of the invention to provide an adjustable method of making trenches in semiconductor IC devices without the formation of top corners at the edges of the trench opening.

The present invention achieves the above-identified objects by providing an adjustable method for making trenches for a semiconductor IC device having eliminated top corners. The adjustable method includes the steps of subsequently forming an oxide layer and a silicon nitride layer on the surface of the device substrate of the device. Trenches are then formed in the device substrate, and filling material is then formed inside the trenches, with the surface of the filling material being relatively lower than the opening of the trench, and further slightly lower than the top surface of the device substrate. A masking layer is then formed on the surface of the silicon nitride layer that has openings corresponding to the openings of the trenches. Dimension of the masking layer opening is relatively greater than the dimension of the opening of the corresponding trench. An anisotropic etching procedure is then performed against the portions of the device substrate exposed out of the coverage of the masking layer, and the anisotropic etching shapes the trench sidewalls into sloped ones having larger dimension at the opening than at the surface of the filling material inside the trenches.

BRIEF DESCRIPTION OF THE DRAWINGS

Other objects, features, and advantages of the present invention will become apparent by way of the following detailed description of the preferred but non-limiting embodiments. The description is made with reference to the accompanying drawings in which.

DESCRIPTION OF THE PREFERRED EMBODIMENT

Figure 1A:
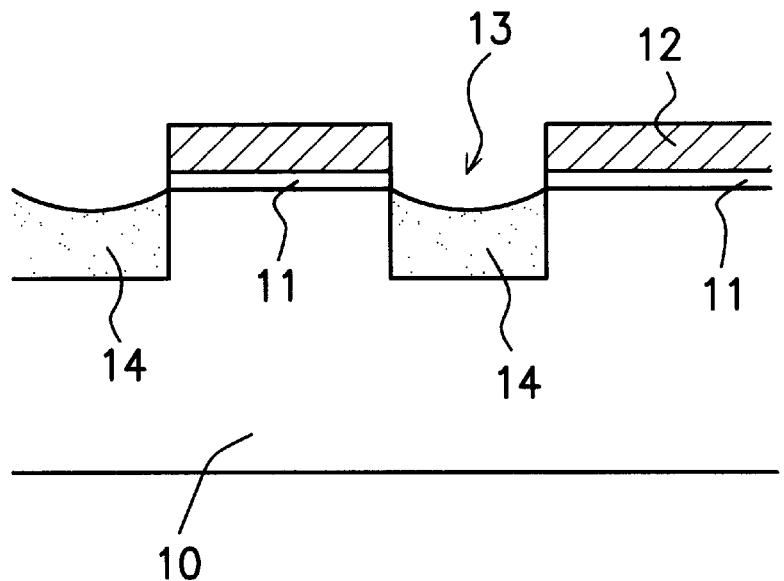
FIG. 1a is a cross-sectional view showing the selected cross section of the structural configuration of a trench together with its filled material as obtained in a conventional chemical-mechanical polishing procedure.
Figure 1B:
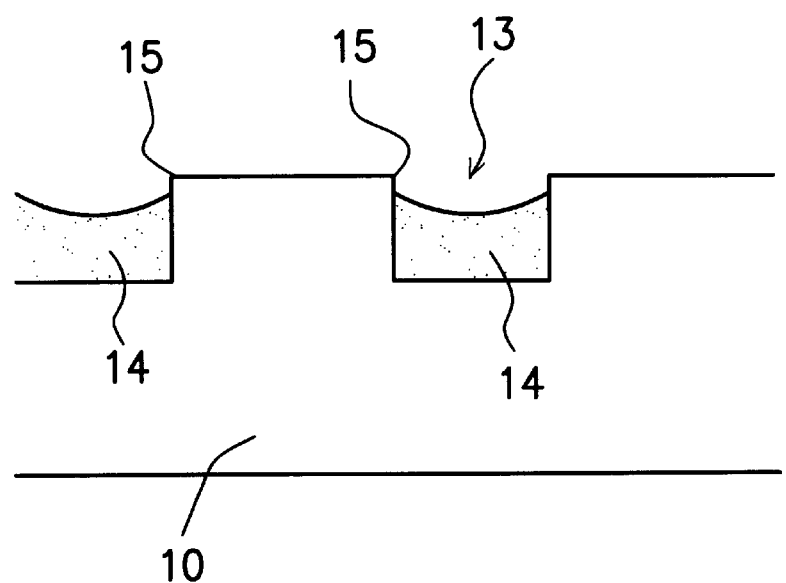
FIG. 1b is a cross-sectional view of the trench structural configuration after the silicon nitride layer is removed.
Figure 2A:
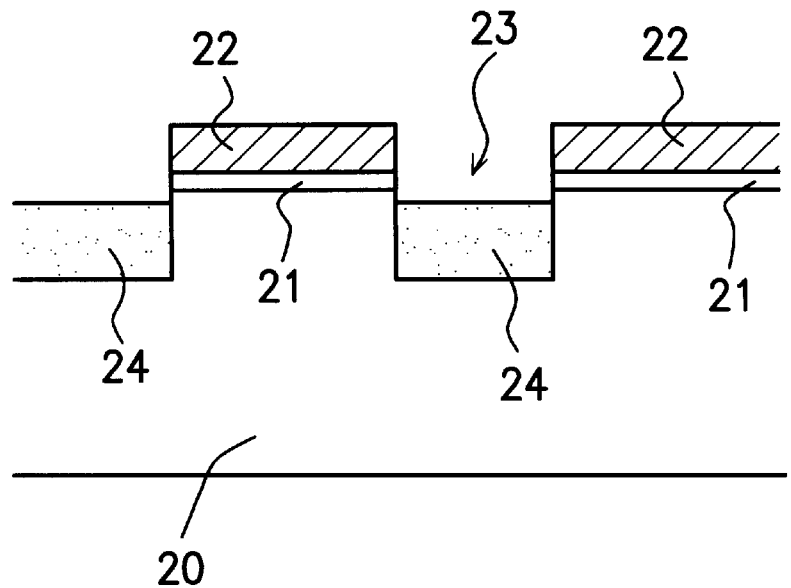
FIGS. 2a–2d are cross-sectional views of process stages selected from the process stages of a fabrication method in accordance with a preferred embodiment of the invention.

Refer to FIGS. 2a–2d, a description of a fabrication process follows that can explain how the top corners can be eliminated for IC devices fabricated in accordance with the preferred embodiment of the invention. As is illustrated in FIG. 2a, an oxide layer 21 and a silicon nitride layer 22 are subsequently formed on the surface of the device substrate 20. A photoresist layer is then formed covering the silicon nitride layer 22 which is then defined with the specific pattern that is required for the fabrication of the trenches. The patterned photoresist layer is then used as the protective mask for implementing an etching procedure to form the trenches 23. Afterwards, the photoresist layer is then removed.

Then, a layer of covering material 24 is formed covering the silicon nitride layer 22 as well as being filled into the trenches 23. This covering layer 24 may be formed of metal or oxide material in a process of, for example, deposition. The covering material 24 on the surface of the silicon nitride layer 22 is completely removed in a process of, for example, etching. During this process, the surface of the covering material 24 inside the trench 23 is controlled not only lower than the exposed surface of the silicon nitride layer 22, it is also slightly lower than the top surface of the device substrate 20 itself Then, as in FIG. 2b, a masking layer 25 such as a photoresist is formed on the surface of the device. This masking layer 25 is configured to have the corresponding patterning that reveals the opening of the trenches 23, but with the trench opening dimension larger than the opening of the trenches themselves. In general, the surface area for the trench opening in the masking layer is controlled to be about 110% that of the trench opening itself Note at this point that the edges 26a of the silicon nitride layer 22 proximate to the opening of the trenches 23 are substantially right-angle corners.

Figure 2B:
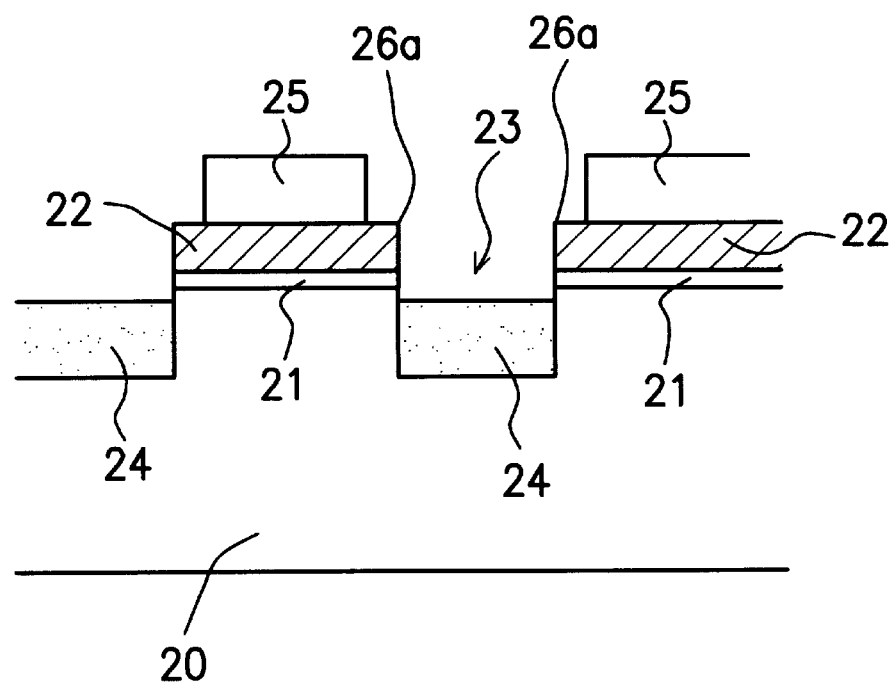

The structural configuration of FIG. 2b is now subject to an anisotropic etching procedure utilizing the masking layer 25 as the protective masking layer. All those portions not covered under the masking layer 25 are anisotropically etched simultaneously. These include the small portions of the top surface of the silicon nitride layer 22 exposed out of the coverage of the mask 25 and the sidewall of the trenches 23 themselves.

Figure 2C:
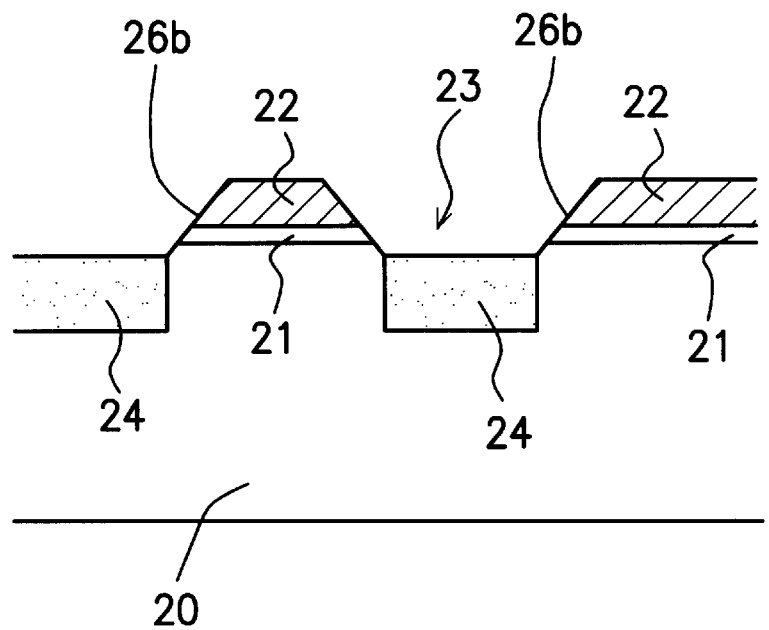

When the anisotropic etching procedure concludes, a structure schematically shown in the cross-sectional view of FIG. 2c is resulted. Due to the nature of anisotropic etching, the right angles (26a in FIG. 2b) that would otherwise become the disadvantageous top corners are now eliminated, and the sidewalls of trenches 23 are shaped into sloped ones, as are identified in the drawing by reference numerals 26b.

During this anisotropic etching processing, those portions of the oxide layer 21 as well as the device substrate 20 exposed in the plasma etching environment are also removed. Slope of the sidewalls 26b is adjustable under several factors. One factor is the ratio between the dimensions of the opening of the masking layer 25 and that of the trenches 23. Another factor is the height of the surface of the material 24 inside the trenches 23. In general, the larger the dimensional ratio between the openings and the higher the top surface of the material 24 inside the trenches 23, the smaller the slope of the sidewall 26b is obtained, and the reverse is also true. This allows for the easy and convenient control over the slope of the sidewalls 26b.

Figure 2D:
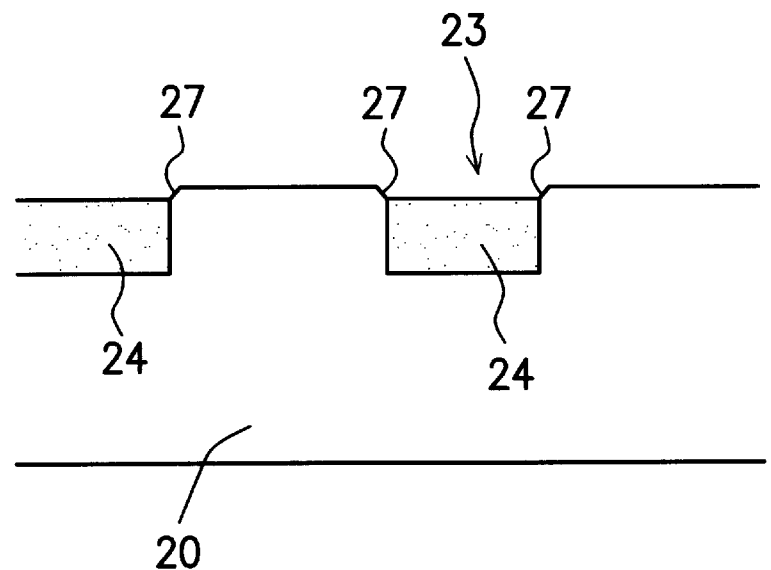

Then, as is illustrated in FIG. 2d, after the removal of the silicon nitride layer 22 and the oxide layer 21, trenches 23 may now have an edge 27 with much easier contour than the right-angled top corners found in the prior-art technique. As mentioned above, this greatly reduces the possibility of producing the problem of electric charge accumulation and its consequent phenomenon of damaging leakage currents. The soft contour at the edge of opening of the trenches 23 as outlined in FIG. 2d can greatly improve the device quality in the post fabrication procedures after the structure shown is obtained.

While the invention has been described by way of example and in terms of preferred embodiment, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. An adjustable method for making trenches for a semiconductor integrated circuit device having eliminated top comers comprises the steps of:

subsequently forming an oxide layer and a silicon nitride layer on the surface of the device substrate of the device, and then forming trenches in the device substrate;

forming a filling material inside the trenches, and the surface of the filling material inside the trenches being relatively lower than the opening of the trench;

forming a masking layer on the surface of the silicon nitride layer having openings corresponding to the openings of the trenches, dimension of the masking layer opening being relatively greater than the dimension of the opening of the corresponding trench; and performing an anisotropic etching procedure against the portions of the device substrate exposed out of the coverage of the masking layer, and the anisotropic etching shaping the trench sidewalls into sloped ones having larger dimension at the opening than at the surface of the filling material inside the trenches.

2. The adjustable method for making trenches according to claim 1, wherein the slope of the shaped trench sidewalls is controlled by the ratio between the dimensions of the opening in the masking layer and the dimension of the opening of the corresponding trench, and the slope is smaller when the dimension of the masking layer opening is more larger than the dimension of the trench opening, and the slope is greater when the dimension of the masking layer opening is less larger than the dimension of he trench opening.

3. The adjustable method for making trenches according to claim 1, wherein the slope of the shaped trench sidewalls is controlled by the height of the surface of the filling material inside the trenches, and the slope is smaller when the height of the filling material is closer to the top surface of the device substrate, and the slope is greater when the height of the filling material is less closer to the top surface of the device substrate.

4. The adjustable method for making trenches according to claim 1, wherein the step of forming the filling material inside the trenches further comprises depositing a metal into the trenches and then performing a chemical-mechanical polishing procedure to remove the deposited metal on the surface of the silicon nitride layer.

5. The adjustable method for making trenches according to claim 1, wherein the step of forming the filling material inside the trenches further comprises depositing an oxide into the trenches and then performing a chemical-mechanical polishing procedure to remove the deposited oxide on the surface of the silicon nitride layer.

6. The adjustable method for making trenches according to claim 1, wherein the step of forming the masking layer further comprises forming a photoresist layer on the surface of the silicon nitride layer and then patterning the photoresist layer to form openings in the photoresist layer corresponding to the openings of each of the trenches.

7. The adjustable method for making trenches according to claim 1, wherein the surface area of the opening in the masking layer is about 110 percent of the surface area of the opening of the corresponding trench.

8. The adjustable method for making trenches according to claim 1, wherein the surface of the filling material inside the is further relatively lower than the top surface of the device substrate.

9. An adjustable method for making trenches for a semiconductor integrated circuit device having eliminated top corners comprising the steps of:

subsequently forming an oxide layer and a silicon nitride layer on the surface of the device substrate of the device, and then forming trenches in the device substrate;

forming a filling material inside the trenches, and the surface of the filling material inside the trenches being relatively lower than the opening of the trench and further slightly lower than the top surface of the device substrate;

forming a masking layer on the surface of the silicon nitride layer having openings corresponding to the openings of the trenches, dimension of the masking layer opening being about 110 percent relatively greater than the dimension of the opening of the corresponding trench; and performing an anisotropic etching procedure against the portions of the device substrate exposed out of the coverage of the masking layer, and the anisotropic etching shaping the trench sidewalls into sloped ones having larger dimension at the opening than at the surface of the filling material inside the trenches.

10. The adjustable method for making trenches according to claim 9, wherein the slope of the shaped trench sidewalls is controlled by the ratio between the dimensions of the opening in the masking layer and the dimension of the opening of the corresponding trench, and the slope is smaller when the dimension of the masking layer opening is more larger than the dimension of the trench opening, and the slope is greater when the dimension of the masking layer opening is less larger than the dimension of he trench opening.

11. The adjustable method for making trenches according to claim 9, wherein the slope of the shaped trench sidewalls is controlled by the height of the surface of the filling material inside the trenches, and the slope is smaller when the height of the filling material is closer to the top surface of the device substrate, and the slope is greater when the height of the filling material is less closer to the top surface of the device substrate.

12. The adjustable method for making trenches according to claim 9, wherein the step of forming the filling material inside the trenches further comprises depositing a metal into the trenches and then performing a chemical-mechanical polishing procedure to remove the deposited metal on the surface of the silicon nitride layer.

13. The adjustable method for making trenches according to claim 9, wherein the step of forming the filling material inside the trenches further comprises depositing an oxide into the trenches and then performing a chemical-mechanical polishing procedure to remove the deposited oxide on the surface of the silicon nitride layer.

14. The adjustable method for making trenches according to claim 9, wherein the step of forming the masking layer further comprises forming a photoresist layer on the surface of the silicon nitride layer and then patterning the photoresist layer to form openings in the photoresist layer corresponding to each of the trenches.

* * * * *